United States Patent
Sunwoo

(10) Patent No.: US 9,928,140 B2
(45) Date of Patent: Mar. 27, 2018

(54) NON-VOLATILE MEMORY DEVICE AND METHOD OF OPERATING THE SAME

(71) Applicant: Samsung Electronics Co., Ltd., Suwon-si (KR)

(72) Inventor: Jung Sunwoo, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/377,518

(22) Filed: Dec. 13, 2016

(65) Prior Publication Data

US 2017/0269998 A1     Sep. 21, 2017

(30) Foreign Application Priority Data

Mar. 17, 2016 (KR) .................. 10-2016-0031999

(51) Int. Cl.
*G11C 16/04* (2006.01)
*G06F 11/10* (2006.01)
*G11C 29/52* (2006.01)

(52) U.S. Cl.
CPC ...... *G06F 11/1072* (2013.01); *G06F 11/1044* (2013.01); *G06F 11/1068* (2013.01); *G11C 29/52* (2013.01)

(58) Field of Classification Search
CPC ........ G11B 11/10576; G11B 11/10595; G11B 7/09; G11B 11/10563; G11B 17/043; G11B 17/0438; G11B 2007/0919; G11B 20/10009; G11B 20/1258; G11B 21/10; G11B 21/106; G11B 5/5526

USPC ........... 365/185.09, 185.18, 185.05, 185.12, 365/185.17, 185.33, 189.05, 200, 201, 365/230.03, 230.08

See application file for complete search history.

(56) References Cited

U.S. PATENT DOCUMENTS

| | | | |
|---|---|---|---|
| 7,079,653 | B2 | 7/2006 | Scheidt et al. |
| 7,738,660 | B2 | 6/2010 | Scheidt et al. |
| 8,127,200 | B2 | 2/2012 | Sharon et al. |
| 8,261,159 | B1 | 9/2012 | Sommer et al. |
| 8,270,227 | B2 | 9/2012 | Park et al. |
| 8,301,912 | B2 | 10/2012 | Lin et al. |
| 8,429,330 | B2 | 4/2013 | Wan et al. |
| 8,665,648 | B2 | 3/2014 | Mun et al. |
| 8,694,873 | B2 | 4/2014 | Kim et al. |
| 8,867,283 | B2 | 10/2014 | Park et al. |
| 2013/0173983 | A1* | 7/2013 | Chung ............... G11C 11/5628 714/752 |
| 2015/0261606 | A1 | 9/2015 | Chung et al. |

* cited by examiner

*Primary Examiner* — Thong Q Le
(74) *Attorney, Agent, or Firm* — Muir Patent Law, PLLC

(57) ABSTRACT

A method of operating a non-volatile memory device, includes, storing sensed data in a page buffer circuit by sensing data stored in a source page of a memory cell array, outputting the sensed data from the page buffer circuit, performing error correction code (ECC) decoding of the sensed data output from the page buffer circuit, storing the decoded data in the page buffer circuit, and providing de-randomized data to an external device as read data by performing de-randomizing of the decoded data output from the page buffer circuit using seed values corresponding to the source page.

20 Claims, 23 Drawing Sheets

| PAGE | SECTOR | | | |
|---|---|---|---|---|
| | SEC1 | SEC2 | SEC3 | SEC4 |
| P1 | RSD11 | RSD12 | RSD13 | RSD14 |
| P2 | RSD21 | RSD22 | RSD23 | RSD24 |
| P3 | RSD31 | RSD32 | RSD33 | RSD34 |
| ⋮ | ⋮ | ⋮ | ⋮ | ⋮ |

NON-VOLATILE MEMORY DEVICE AND METHOD OF OPERATING THE SAME

CROSS-REFERENCE TO RELATED APPLICATION

This U.S. Non-provisional application claims priority under 35 USC § 119 to Korean Patent Application No. 10-2016-0031999, filed on Mar. 17, 2016, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a non-volatile memory device and a method of operating a non-volatile memory device to efficiently perform randomizing and de-randomizing.

2. Discussion of the Related Art

Semiconductor memory devices for storing data may be classified into volatile memory devices and non-volatile memory devices. Volatile memory devices, such as dynamic random access memory (DRAM) devices, are typically configured to store data by charging or discharging capacitors in memory cells, and lose the stored data when power is off. Non-volatile memory devices, such as flash memory devices, may maintain stored data even though power is off. Volatile memory devices are widely used as main memories of various apparatuses, while non-volatile memory devices are widely used for storing program codes and/or data in various electronic devices, such as computers, mobile devices, etc.

Memory capacity of semiconductor memory devices is increasing according to developments of manufacturing processes. As integration degree of semiconductor memory devices increases, the number of defective memory cells increases and coupling interference between adjacent memory cells also increases. Such increase of the defective memory cells and the coupling interference results in decrease of yield of semiconductor memory devices. An error correction code (ECC) operation may be performed to repair the defective memory cells and randomization of data may be performed to reduce the coupling interference. Yield and performance of semiconductor memory devices may depend on efficiency of the ECC and the randomization.

SUMMARY

Some example embodiments may provide a non-volatile memory device capable of enhancing an efficiency of the ECC and the randomization.

Some example embodiments may provide a method of operating a non-volatile memory device capable of enhancing an efficiency of the ECC and the randomization.

According to example embodiments, a method of operating a non-volatile memory device, includes, storing sensed data in a page buffer circuit by sensing data stored in a source page of a memory cell array, outputting the sensed data from the page buffer circuit, performing error correction code (ECC) decoding of the sensed data output from the page buffer circuit, storing the decoded data in the page buffer circuit, and providing de-randomized data to an external device as read data by performing de-randomizing of the decoded data output from the page buffer circuit using seed values corresponding to the source page.

According to example embodiments, a non-volatile memory device includes a memory cell array, a page buffer, an on-chip ECC engine and an on-chip randomization circuit. The memory cell array includes a plurality of memory cells forming a plurality of pages. The page buffer circuit stores data of one page of the plurality of pages. The on-chip ECC engine performs ECC encoding of a first set of data received from an external device such that the on-chip ECC engine provides encoded data to the page buffer circuit, or performs ECC decoding of a second set of data stored in the page buffer such that the on-chip ECC engine provides decoded data to the page buffer circuit. The on-chip randomization circuit performs randomizing the encoded data using seed values corresponding to a target page of the plurality of pages such that the on-chip randomization circuit provides randomized data to the page buffer circuit, or performs de-randomizing the decoded data using seed values corresponding to a source page of the plurality of pages such that the on-chip randomization circuit provides de-randomized data to an external device as read data.

According to example embodiments, a memory device includes a memory cell array having a plurality of memory cells, a page buffer circuit is configured to store a first set of data output from the plurality of memory cells and a second set of data, an error correction code (ECC) circuit is configured to perform ECC decoding of the first set of data such that the ECC circuit provides the second set of data to the page buffer circuit as decoded data, and a randomization circuit is configured to perform de-randomizing of the second set of data output from the page buffer circuit such that the randomization circuit provides de-randomized data to an external device as read data.

The non-volatile memory device and the method of operating the non-volatile memory device according to example embodiments may enhance performance of the non-volatile memory device by separating or independently performing the ECC decoding and the de-randomizing. The seed values may be stored while the ECC decoding is performed to perform the de-randomizing using the stored seed values, and thus the read time may be reduced. In addition, according to the result of the ECC decoding, only the correction bits may be stored in the page buffer circuit whereas the rest of bits may be maintained in the page buffer circuit, and thus the read time and the power consumption may be reduced.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
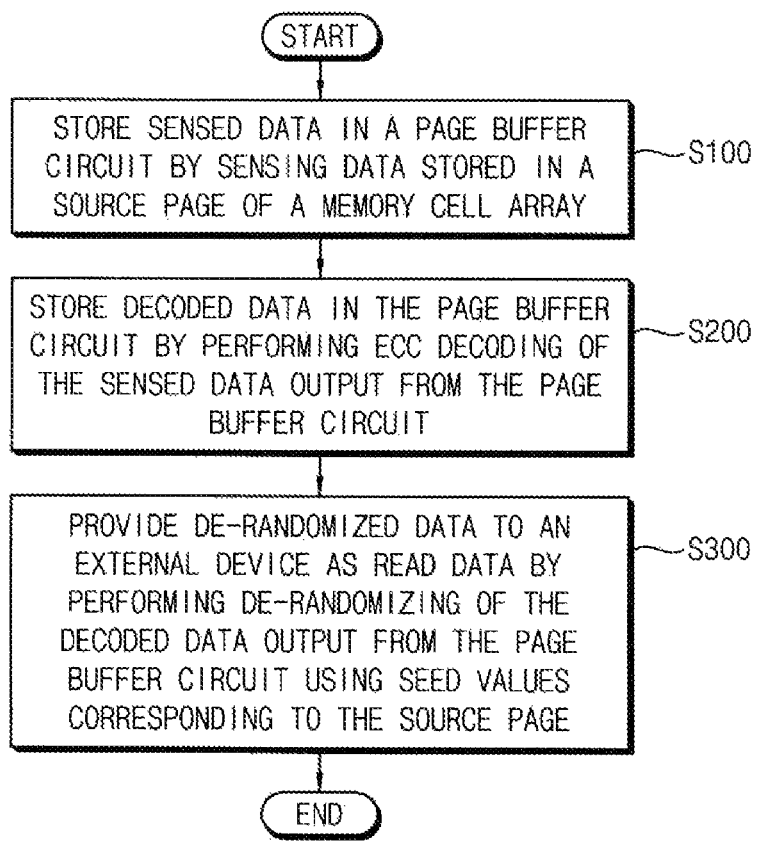
FIG. 1 is a flow chart illustrating a method of operating a non-volatile memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of operating a non-volatile memory device according to example embodiments.

A method corresponding to a read operation of a non-volatile memory device is illustrated in FIG. 1. Referring to FIG. 1, sensed data are stored in a page buffer circuit by sensing data stored in a source page of a memory cell array (S100). Decoded data are stored in the page buffer circuit by performing error correction code (ECC) decoding of the sensed data from the page buffer circuit (S200). Herein, the error correction code (ECC) may be referred to as an error check and correction (ECC). De-randomized data are provided to an external device as read data by performing de-randomizing of the decoded data output from the page buffer circuit using seed values corresponding to the source page (S300).

In a conventional non-volatile memory device including an on-chip ECC circuit and an on-chip randomization circuit, the de-randomizing is performed in association with the ECC decoding. In this case, data bits of a page size have to be loaded from the page buffer circuit and sequentially stored back in the page buffer circuit. The time for such loading and storing form and to the page buffer circuit is increased and thus the read time of the non-volatile memory device is increased. In addition, because the decoded and de-randomized data are stored again in the page buffer circuit, the power noise is increased due to the increase of the operation current and thus probability of data fail is increased.

In contrast, in the non-volatile memory device and the method of operating the non-volatile memory device, the ECC decoding and the de-randomizing are separated and performed independently and thus performance of the non-volatile memory device may be enhanced. The seed values may be stored while the ECC decoding is performed to perform the de-randomizing using the stored seed values, and thus the read time may be reduced. In addition, according to the result of the ECC decoding, only the correction bits may be stored in the page buffer circuit whereas the rest of bits may be maintained in the page buffer circuit, and thus the read time and the power consumption may be reduced.

Figure 2:
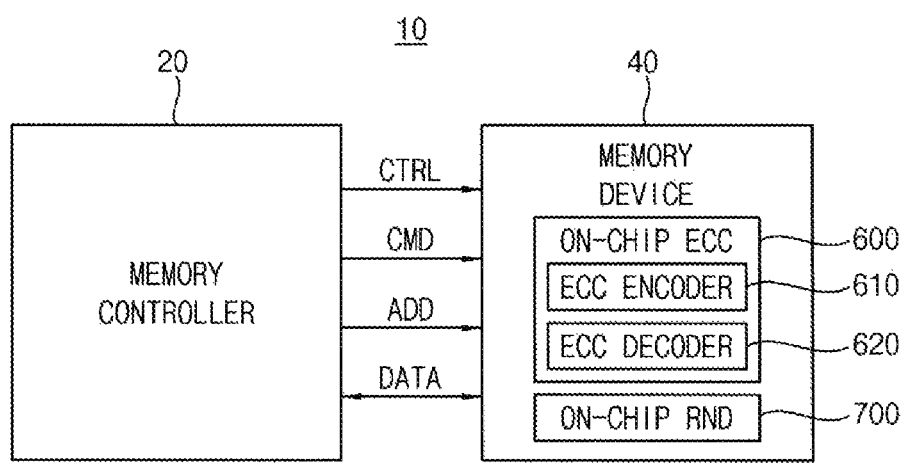
FIG. 2 is a block diagram illustrating a memory system according to example embodiments.

FIG. 2 is a block diagram illustrating a memory system according to example embodiments.

Referring to FIG. 2, a memory system 10 may include a memory controller 20 and a non-volatile memory device 40.

The non-volatile memory device 40 may perform read, write and erase operations under control of the memory controller 20. The non-volatile memory device 40 may receive control signals CTRL, commands CMD, addresses ADD and write data DATA from the memory controller 20 and transmit read data DATA to the memory controller 20.

The non-volatile memory device 40 may include an on-chip ECC engine (or, an ECC circuit) 600. The ECC engine 600 may include an ECC encoder 610 and an ECC decoder 620 as illustrated in FIG. 2 to check and correct error bits. The ECC engine 600 may perform the ECC operation on data units of ECC sectors. For example, the data unit of a page may be 8 KB though 64 KB and the data unit of each of the ECC sectors may be 1 KB through 4 KB.

The ECC encoder 610 may perform error correction encoding or ECC encoding of the data provided to the non-volatile memory device 40 to generate a codeword including parity bits. The codeword may be transferred to and stored in the memory cell array. The ECC encoder 610 may perform the encoding on data units of ECC sectors. The ECC decoder 620 may perform error correction decoding or ECC decoding of the data read out from the memory cell array and determine fail or success of the error correction decoding. The ECC decoder 620 may correct the error bits of the data using the parity bits in the codeword. The ECC encoder 610 and the ECC decoder 620 may check and correct bit errors using coded modulations such as low density parity check (LPC) code, Bose, Chaudhuri, Hocquenghem (BCH) code, turbo code, Reed-Solomon code (RSC), convolution code, recursive systematic code, trellis-coded modulation (TCM), block coded modulation (BCM), etc.

The non-volatile memory device 40 may include an on-chip randomization circuit 700. The on-chip randomization circuit 700 may perform randomizing of data using a target page of the memory cell array to provide randomized data during a write operation. In addition, the on-chip randomization circuit 700 may perform de-randomizing of data using a source page of the memory cell array to provide de-randomized data during a read operation. The randomization is being widely used to remove pattern dependency of the data to be written to the memory cell array. For example, seed values for the write operation may be generated by a predetermined method and the randomizing may be performed such that a logical operation such as an XOR operation is performed on the original data (e.g., data received from an external device) and the seed values to store or write the randomized data to the memory cell array. During the read operation, the original data may be restored by performing the de-randomizing such that the logical operation is performed on the randomized data and the seed values equal to those of the write operation. An example embodiment of the on-chip randomization circuit 700 will be described below with reference to FIGS. 10 and 11.

Figure 3:
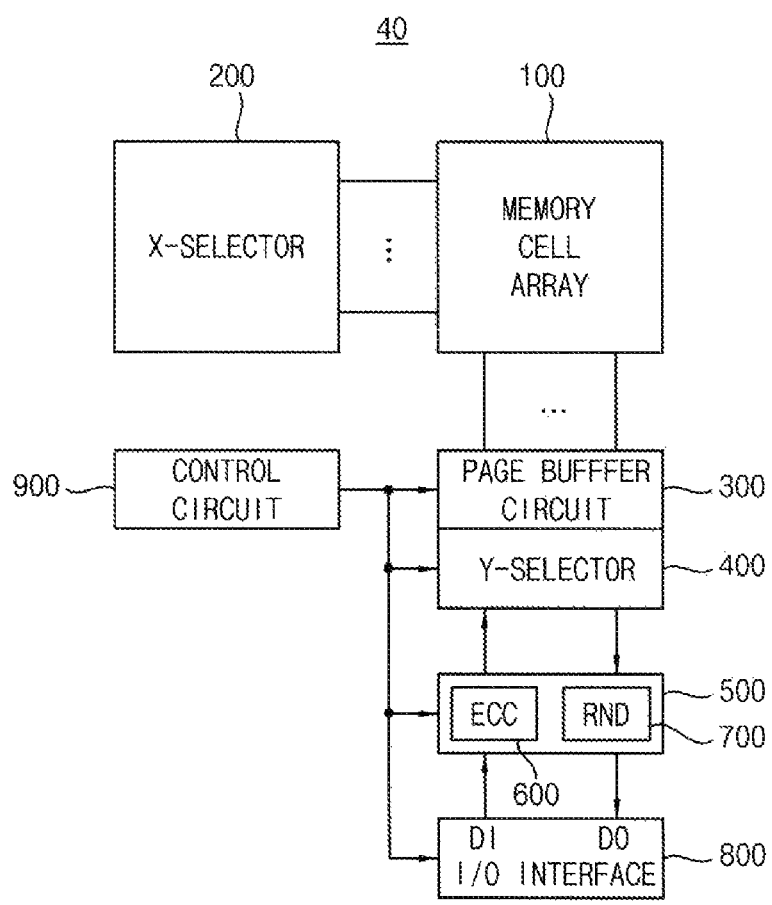
FIG. 3 is a block diagram illustrating a non-volatile memory device according to example embodiments.

FIG. 3 is a block diagram illustrating a non-volatile memory device according to example embodiments.

Referring to FIG. 3, a non-volatile memory device 40, which is assumed to be a flash memory device, includes a memory cell array 100, a row selector 200 (X-selector), a page buffer circuit 300, a column selector (Y-selector) 400, a data processing block 500, an input/output (I/O) interface 800 and a control circuit 900. The data processing block 500 may include an on-chip ECC engine 600 and an on-chip randomization circuit 700.

The memory cell array 100 includes a plurality of memory cells each of which is connected to a respective one of wordlines WL and a respective one of bitlines BL. As will be described below with reference to FIGS. 20, 21 and 22, the plurality of memory cells may include NAND flash memory cells or NOR flash memory cells, and may be arranged in a two-dimensional (2-D) array structure or a three-dimensional (3-D) vertical array structure (e.g., a vertical memory device having a stacked structure). In addition, as will be described below with reference to FIGS. 23 through 27, the plurality of memory cells may include resistive memory cells of various types.

In example embodiments, the plurality of memory cells may include single-level memory cells (SLC) in which only one bit is stored in each of memory cells and/or multi-level memory cells (MLC) in which more than two bits are stored in each of memory cells. In the MLC, the memory cells may be programmed using various program methods, such as a shadow programming scheme, a reprogramming scheme or an on-chip buffered programming scheme.

The row selector 200 is controlled by the control circuit 900 and performs selecting and driving operations for rows of the memory cell array 100. The control circuit 900 is configured to control an overall operation of the non-volatile memory device 40. The page buffer circuit 300 is controlled by the control circuit 900 and functions as a sense amplifier or a write driver according to an operation mode. For example, during a read operation, a page buffer circuit 300 functions as a sense amplifier sensing data output from memory cells of a selected row or a source page. During a program operation or a write operation, the page buffer circuit 300 functions as a write driver writing data into memory cells of a selected row or a target page. The page buffer circuit 300 includes page buffers corresponding to each of bit lines or bit line pairs. When respective memory cells store multi-bit data, respective page buffers of the page buffer circuit 300 may include two or more latches.

The column selector 400 is controlled by the control circuit 900 and selects columns (or page buffers) in a predetermined sequence during read/program operation.

The on-chip ECC engine 600 performs ECC encoding to provide encoded data and performs ECC decoding to provide decoded data. The on-chip randomization circuit 700 performs randomizing using seed values corresponding to a target page to provide randomized data and performs de-randomizing using seed values corresponding to a source page to provide de-randomized data. In an example embodiment, the randomization circuit 700 may perform a bitwise XOR operation.

The I/O interface 800 provides data output from the data processing block 500 to an external device such as a memory controller (not shown). In addition, the I/O interface 800 provides data received from the external device to the data processing block 500.

Figure 4:
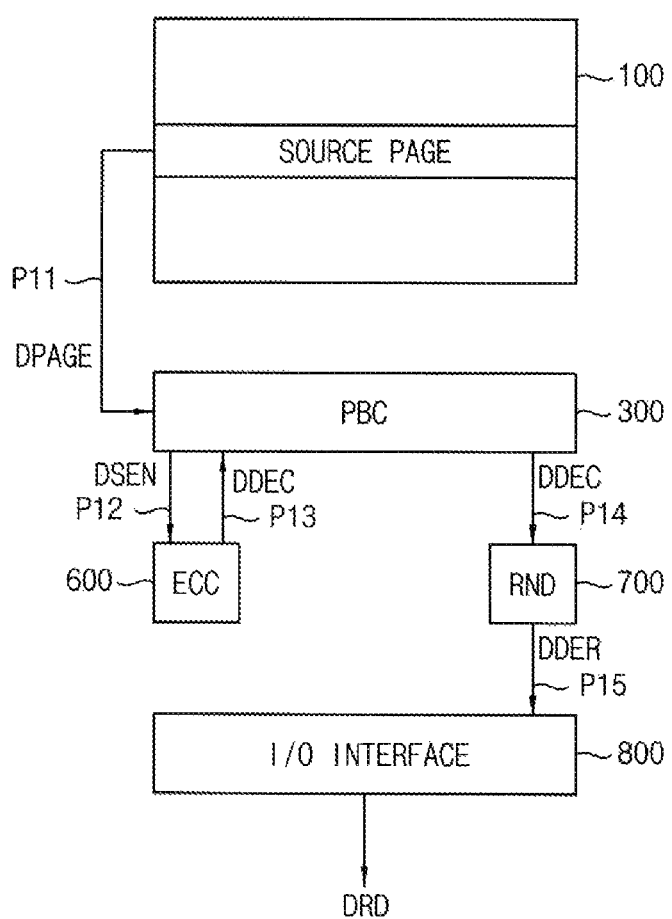
FIG. 4 is a diagram illustrating a data flow in case of independently performing ECC decoding and de-randomizing according to example embodiments.
Figure 5:
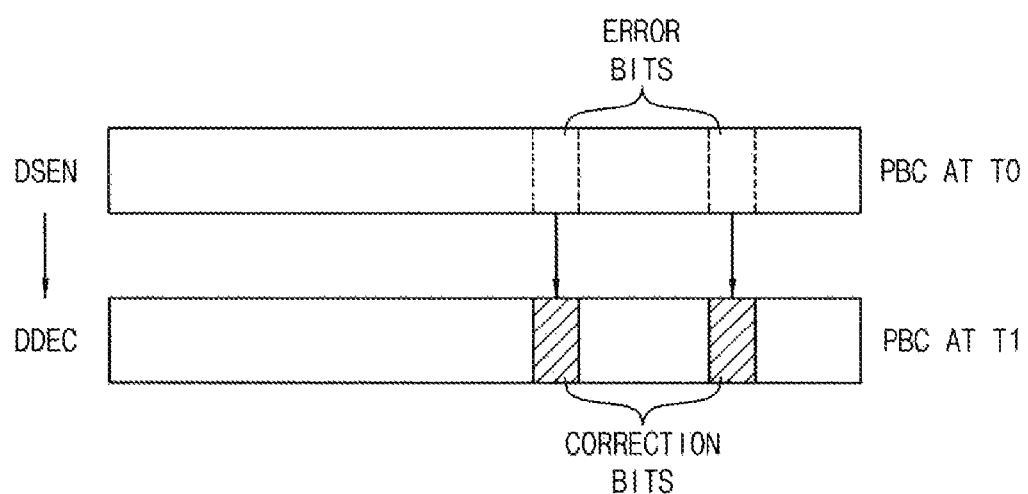
FIG. 5 is a diagram illustrating a method of storing decoded data in case of FIG. 4 according to example embodiments.

FIG. 4 is a diagram illustrating a data flow in case of independently performing ECC decoding and de-randomizing according to example embodiments, and FIG. 5 is a diagram illustrating a method of storing decoded data in case of FIG. 4 according to example embodiments. First through fifths data paths P11 through P15 in FIG. 4 represent temporal order of the data flow.

Referring to FIG. 4, sensed data DSEN are stored in the page buffer circuit (PBC) 300 by sensing data DPAGE (e.g., a first set of data) stored in a source page (e.g., a first page) of the memory cell array 100 (P11). A plurality of memory cells in the source page may correspond to a plurality of memory cells connected to one word line. The page buffer circuit 300 may be connected to bit lines (not shown) corresponding to the source page of the memory cell array 100. Thus, the data DPAGE may be transferred from the memory cell array 100 to the page buffer circuit 300 through the bit lines. Each page buffer of the page buffer circuit 300 may include a sensing node connected to a bit line, a sensing latch, a data latch, a cache latch, and a pre-charge circuit. The on-chip ECC engine 600 receives the sensed data DSEN from the page buffer circuit 300 (P12) to perform ECC decoding and the decoded data DDEC are stored in the page buffer circuit 300 (P13). As will be described with reference to FIG. 8, one page may include a plurality of ECC sectors. In this case, the on-chip ECC engine 600 may perform receiving the sensed data DSEN (P12), the ECC decoding and storing the decoded data DDEC (P13) for one ECC sector, and then repeat the same operations for the next ECC sector. After the ECC decoding and storing the decoded data DDEC are finished with respect to all of the ECC sectors of the page in the page buffer circuit 300, the on-chip randomization circuit 700 receives the decoded data DDEC from the page buffer circuit 300 (P14) to perform de-randomizing of the decoded data DDEC using seed values corresponding to the source page and the de-randomized data DDER are output to the I/O interface 800 (P15). The de-randomized data DDER are provided to the external device such as a memory controller as read data DRD.

The on-chip ECC engine 600 may output the decoded data DDEC including the same data as the sensed data DSEN when the sensed data DSEN has no error bit. In this case, the page buffer circuit 300 does not need to be replaced.

The on-chip ECC engine 600 may output the decoded data DDEC including different data from the sensed data DSEN when the sensed data DSEN has one or more error bits. In this case, the page buffer circuit 300 may be replaced the one or more error bits with one or more correction bits of the decoded data DDEC. In one example embodiment, a comparator (not shown) may provide data to the page buffer circuit 300 as the correction bits after comparing the sensed data DSEN and the decoded data DDEC.

FIG. 5 illustrates a method of storing decoded data DDEC in the page buffer circuit (PBC) 300 along the third data path P13 in FIG. 4. T0 indicates a time point before the decoded data DDEC are stored in the page buffer circuit 300 and T1 indicates a time point after the decoded data DDEC are stored in the page buffer circuit 300. As illustrated in FIG. 5, only the correction bits may be stored in the page buffer circuit 300 for replacing error bits in the sensed data DSEN stored in the page buffer circuit 300. The rest of bits in the sensed data DSEN other than the error bits may be maintained in the page buffer circuit 300 without being replaced. As such, only the correction bits may be replaced in the page buffer circuit 300 whereas the rest of bits may be maintained in the page buffer circuit 300, and thus the read time and the power consumption may be reduced.

Figure 6:
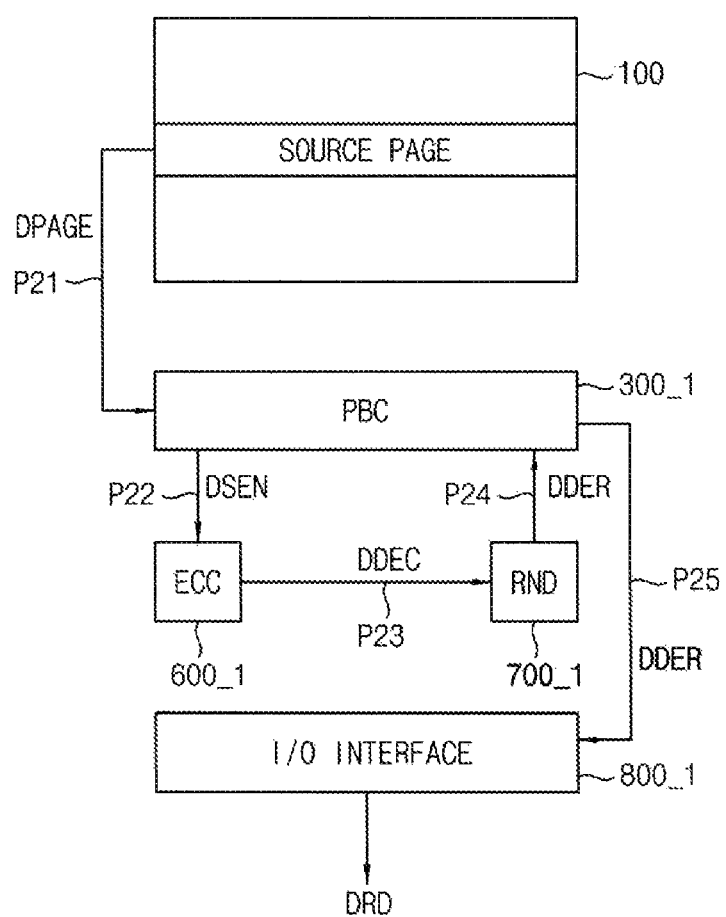
FIG. 6 is a diagram illustrating a data flow in case of sequentially performing ECC decoding and de-randomizing.
Figure 7:
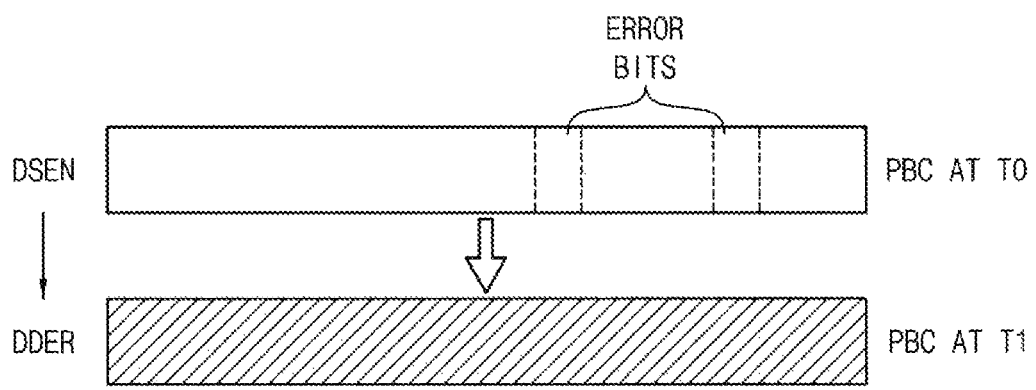
FIG. 7 is a diagram illustrating a method of storing decoded data in case of FIG. 6.

FIG. 6 is a diagram illustrating a data flow in case of sequentially performing ECC decoding and de-randomizing, and FIG. 7 is a diagram illustrating a method of storing decoded data in case of FIG. 6. First through fifth data paths P21 through P25 in FIG. 6 represent temporal order of the data flow.

Referring to FIG. 6, sensed data DSEN are stored in a page buffer circuit (PBC) 300_1 by sensing data DPAGE stored in a source page of a memory cell array 100_1 (P21). An on-chip ECC engine 600_1 receives the sensed data DSEN from the page buffer circuit 300_1 (P22) to perform ECC decoding and the decoded data DDEC are provided to the on-chip randomization circuit 700_1 (P23). The on-chip randomization circuit 700_1 performs de-randomizing of the decoded data DDEC using seed values corresponding to the source page and the de-randomized data DDER are stored in the page buffer circuit 300_1 (P24). The de-randomized data DDER are output from the page buffer circuit 300_1 to an I/O interface 800_1 (P25), and the de-randomized data DDER are provided to an external device such as a memory controller as read data DRD. As will be described with reference to FIG. 8, one page may include a plurality of ECC sectors. In this case, the on-chip ECC engine 600_1 and the on-chip randomization circuit 700_1 may perform receiving the sensed data DSEN (P22), the ECC decoding, the de-randomizing and storing the de-randomized data DDER (P24) for one ECC sector, and then repeat the same operations for the next ECC sector.

FIG. 7 illustrates a method of storing de-randomized data DDER in the page buffer circuit (PBC) 300_1 along the fourth data path P24 in FIG. 6. T0 indicates a time point before the de-randomized data DDER are stored in the page buffer circuit 300_1 and T1 indicates a time point after the de-randomized data DDER are stored in the page buffer circuit 300_1.

In case of FIGS. 4 and 5, only the correction bits may be stored in the page buffer circuit (PBC) 300 for replacing error bits in the sensed data DSEN stored in the page buffer circuit 300. However, in case of FIGS. 6 and 7, all bits in the sensed data DSEN from the page buffer circuit (PBC) 300_1 are sequentially decoded and de-randomized and all bits of the decoded and de-randomized data may be stored back in the page buffer circuit 300_1. Thus the read time and the power consumption are increased in case of FIGS. 6 and 7 because all bits have to be stored in the page buffer circuit 300_1 again.

As described with reference to FIGS. 4 and 5, according to the result of the ECC decoding, only the correction bits may be stored in the page buffer circuit 300 whereas the rest of bits may be maintained in the page buffer circuit 300 without being replaced, and thus the read time and the power consumption may be reduced.

Figure 8:
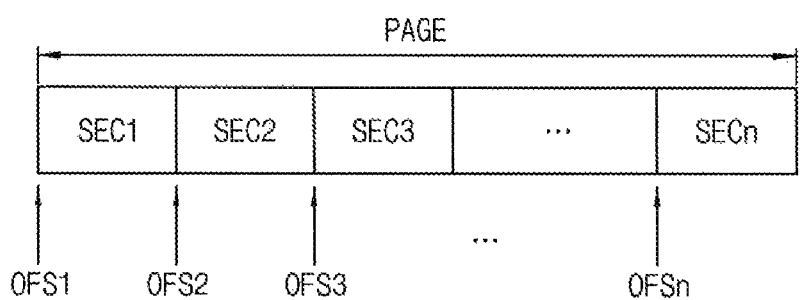
FIG. 8 is a diagram illustrating an example of a page and ECC sectors.
Figures 9, 10:
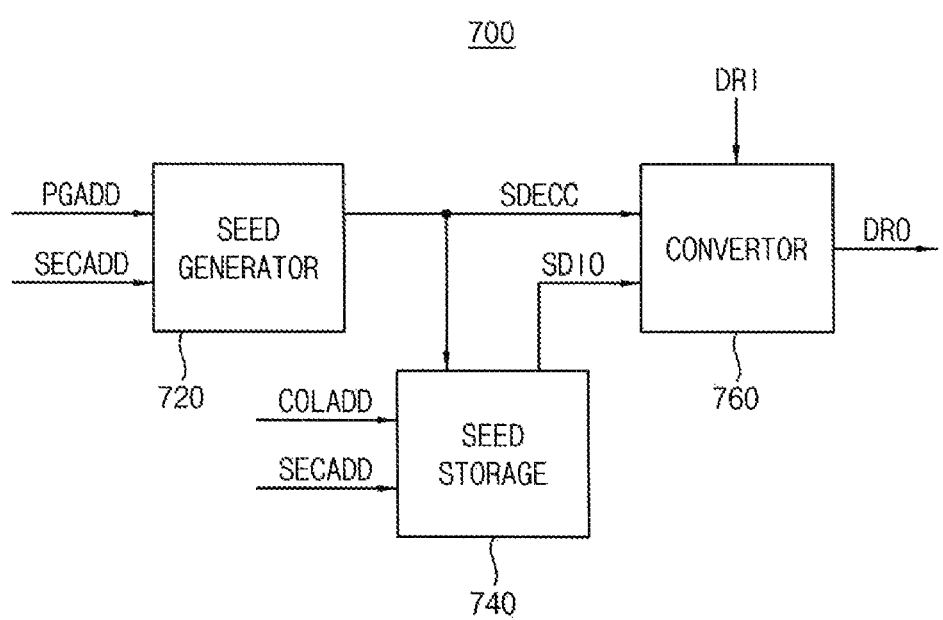
FIG. 9 is a diagram illustrating seed values corresponding to pages and ECC sectors.
FIG. 10 is a block diagram illustrating an example embodiment of an on-chip randomization circuit included in the non-volatile memory device of FIG. 3 according to example embodiments.

FIG. 8 is a diagram illustrating an example of a page and ECC sectors, and FIG. 9 is a diagram illustrating seed values corresponding to pages and ECC sectors.

Referring to FIG. 8, one page may include a plurality of ECC sectors SEC1~SECn. The memory cell array in FIG. 3 may provide memory space corresponding to a plurality of pages and only the memory space corresponding to one page is represented in FIG. 8. The ECC engine in FIG. 3 may perform the ECC operation on data units of the ECC sectors. For example, the data unit of a page may be 8 KB though 64 KB and the data unit of the ECC sector may be 1 KB through 8 KB. The positions of the ECC sectors SEC1~SECn may be represented by sector offset values OFS1~OFSn. In other words, the sector addresses may be represented using the sector offset values OFS1~OFSn.

Referring to FIG. 9, the memory space of the memory cell array may include a plurality of pages P1, P2 and P3, and each page may include a plurality of ECC sectors SEC1~SEC4. FIG. 9 illustrates a non-limiting example of four ECC sectors per page, and the number of ECC sectors per page may be determined variously. As illustrated in FIG. 9, the respective seed values RSD11~RSD34 may be assigned to each page and each ECC sector. Each of the seed values RSD11~RSD34 may be one bit or a sequence of multiple bits. In some example embodiments, each of the seed values RSD11~RSD34 may be generated based on a page address and a sector address. In other example embodiments, the seed values RSD11~RSD34 may be predetermined and stored in a form of lookup table.

FIG. 10 is a block diagram illustrating an example embodiment of an on-chip randomization circuit included in the non-volatile memory device of FIG. 3 according to example embodiments.

Referring to FIG. 10, a randomization circuit 700 may include a seed generator 720, a seed storage 740 and a converter 760.

The seed generator 720 generates an ECC seed signal SDECC based on a page address signal PGADD and a sector address signal SECADD. The seed generator 720 may output, as the ECC seed signal, a seed value corresponding to a present address represented by the page address signal PGADD and the sector address signal SECADD. Accordingly the ECC seed signal SDECC may include varying seed values as the page address PGADD and the sector address signal SECADD are varied. For example, when the page address signal PGADD indicates the second page P2 in FIG. 9 and the sector address signal SECADD indicates the first through fourth sectors SEC1, SEC2, SEC3 and SEC4 sequentially, the ECC seed signal SDECC may include the four seed values RSD21, RSD22, RSD23 and RSD24 sequentially.

The seed storage 740 generates an input-output seed signal SDIO based on the ECC seed signal SDECC, a column address signal COLADD and a sector address signal SECADD. An example embodiment of the seed storage 740 will be described below with reference to FIG. 11.

The converter 760 may provide output data DRO based on input data DRI and the ECC seed signal SDECC or the input-output seed signal SDIO. In an example embodiment, the converter 760 is configured to perform a bitwise XOR operation. When the ECC operation and the randomization are pipelined or performed sequentially, the converter 760 may perform a logical operation on the input data DRI and the ECC seed signal SDECC to provide the output data DRO. In contrast, when the ECC operation and the randomization are performed independently, the converter 760 may perform the logical operation on the input data DRI and the input-output seed signal SDIO to provide the output data DRO.

The on-chip randomization circuit 700 may perform the randomizing and the de-randomizing. In the write operation, the input data DRI may be the encoded data that is the result of the ECC encoding and the output data DRO may be the randomized data. In the read operation, the input data DRI may be the decoded data that is the result of the ECC decoding and the output data DRO may be the de-randomized data. In some example embodiments, the randomization circuit may be separated to a portion to perform the randomizing and a portion to perform the de-randomizing.

Figure 11:
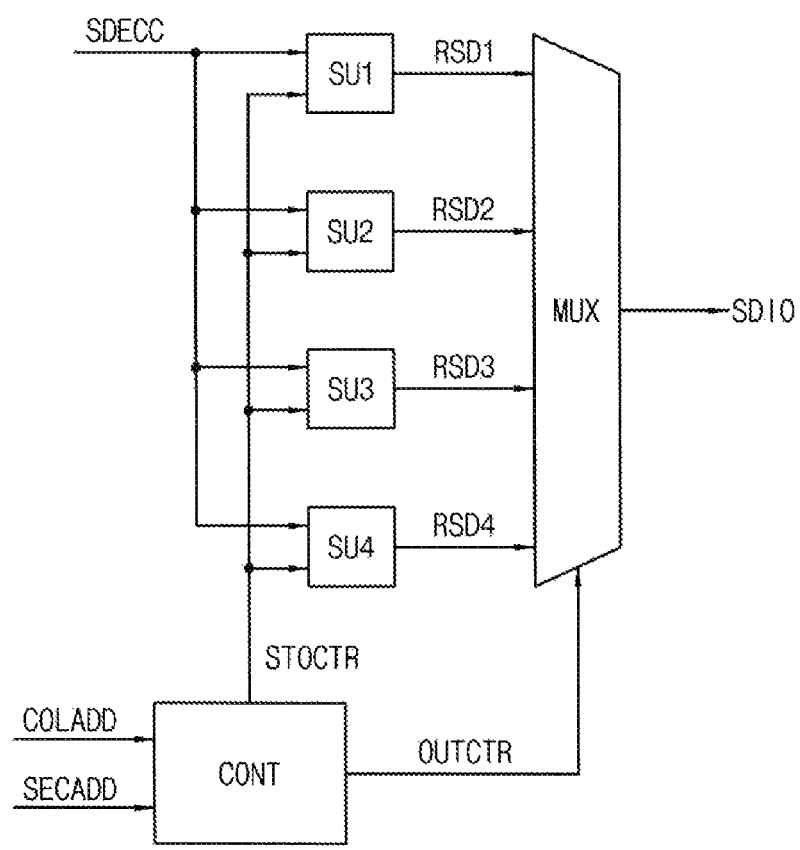
FIG. 11 is a diagram illustrating an example embodiment of a seed storage included in the on-chip randomization circuit of FIG. 10 according to example embodiments.

FIG. 11 is a diagram illustrating an example embodiment of the seed storage included in the on-chip randomization circuit of FIG. 10 according to example embodiments.

Referring to FIG. 11, the seed storage 740 may include a plurality of storage units SU1~SU4, a selector MUX and a controller CONT. The seed storage 740 may store seed values output from the seed generator 720 while the ECC decoding is performed by the on-chip ECC engine and output the stored seed values to the converter 760 while the de-randomizing is performed.

The controller CONT may generate an input control signal STOCTR and an output control signal OUTCTR based on a column address signal COLADD and a sector address signal SECADD. The input control signal STOCTR may indicate the ECC sector that is represented by the present value of the sector address signal SECADD. The output control signal OUTCTR may indicate the ECC sector that is represented by the present value of the column address signal COLADD.

The storage units SU1~SU4 may correspond to ECC sectors SEC1~SEC4, respectively. FIG. 11 illustrates a non-limiting example of the four storage units SU1~SU4 corresponding to the four ECC sectors SEC1~SEC4 and the number of the storage units may be determined variously according to the number of ECC sectors per page.

The seed storage 740 may store each of the seed values RSD1~RSD4 corresponding to each of the ECC sectors SEC1~SEC4 in each of the storage units SU1~SU4 based on the sector address signal SECADD. The controller CONT may generate the input control signal STOCTR based on the sector address signal SECADD and the seed values RSD1~RSD4 provided through the ECC seed signal SDECC may be stored in the storage unites SU1~SU4 respectively in response to the input control signal STOCTR.

In addition, the seed storage 740 may output the seed value corresponding to a present column address from one of the storage units SU1~SU4 based on the column address signal COLADD. The controller CONT may generate the output control signal OUTCTR indicating the current column address based on the column address signal COLADD and the selector MUX may select and output one of the seed values RSD1~RSD4 from the storage units SU1~SU4 as the input-output seed signal SDIO in response to the output control signal OUTCTR. As the column address of the column address signal COLADD is varied the seed value of the input-output seed signal SDIO is varied.

As such, the seed values may be stored in advance using the seed storage 740 and output timing of the input-output seed signal SDIO may be controlled according to the column address signal COLADD. Using the input-output seed signal SDIO, the randomization operation including the randomizing and the de-randomizing may be separated and performed independently from the ECC operation including the ECC encoding and the ECC decoding.

Figure 12:
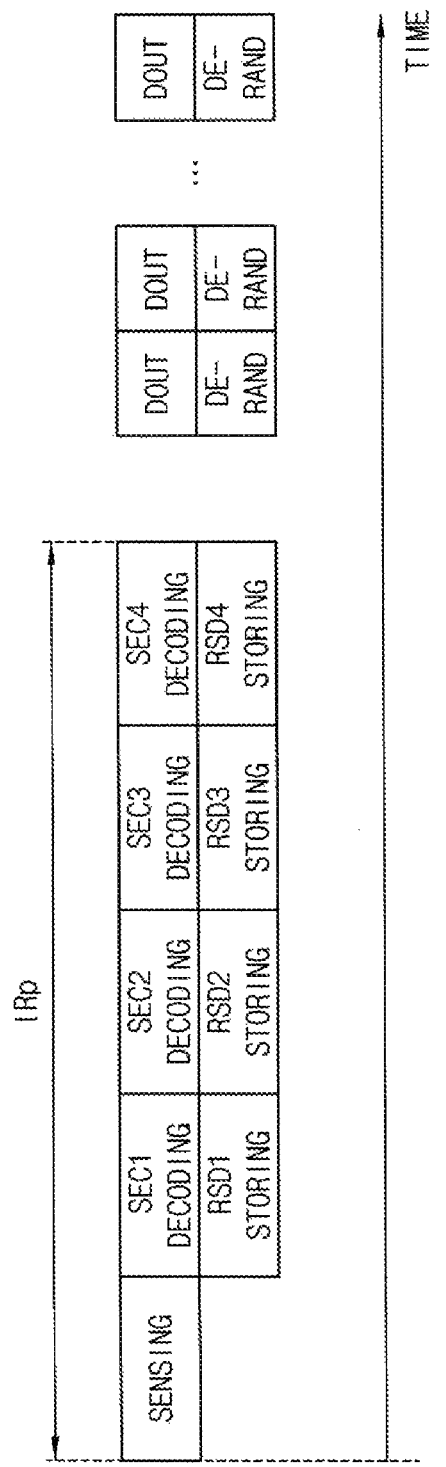
FIG. 12 is a diagram illustrating a read time in case of independently performing ECC decoding and de-randomizing according to example embodiments.
Figure 13:
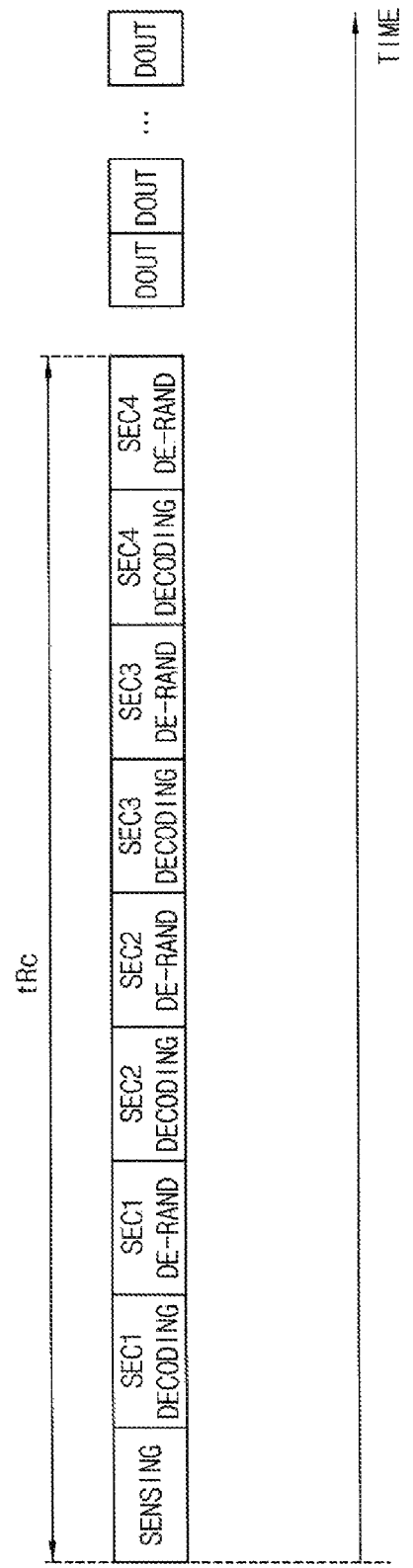
FIG. 13 is a diagram illustrating a read time in case of sequentially performing ECC decoding and de-randomizing.

FIG. 12 is a diagram illustrating a read time in case of independently performing ECC decoding and de-randomizing according to example embodiments, and FIG. 13 is a diagram illustrating a read time in case of sequentially performing ECC decoding and de-randomizing.

Referring to FIGS. 4, 11 and 12, the sensed data DSEN are stored in the page buffer circuit 300 after sensing of the data stored in the memory cell array is finished. After the sensed data DSEN are stored in the page buffer circuit 300, the ECC decoding is performed with respect to each of the ECC sectors SEC1~SEC4 and the decoded data DDEC are stored in the page buffer circuit 300 sequentially. Further the seed values RSD1~RSD4 corresponding to the ECC sectors SEC1~SEC4 of the source page are stored in the storage units SU1~SU4 of the seed storage 740 while the ECC decoding is performed and the decoded data DDEC are stored in the page buffer circuit 300. The seed values RSD1~RSD4 stored in the storage units SU1~SU4 are provided for the de-randomizing DE_RAND during the data output DOUT.

As such, when the ECC decoding and the de-randomizing are performed independently according to example embodiments, the seed values may be stored while the ECC decoding is performed and the de-randomizing may be performed using the stored seed value during the data output. As a result, the read data DRD may be output form the I/O interface 800 with a decreased read time tRp.

Referring to FIGS. 6 and 13, the sensed data DSEN are stored in the page buffer circuit 300_1 after sensing of the data stored in the memory cell array is finished. After the sensed data DSEN are stored in the page buffer circuit 300_1, the ECC decoding and the de-randomizing of the decoded data DDEC are performed sequentially with respect to each of the ECC sectors SEC1~SEC4 and the de-randomized data DDER are stored in the page buffer circuit 300_1 sequentially.

As such, when the ECC decoding and the de-randomizing are associated and performed sequentially, the read data DRD may be output form the I/O interface 800_1 with an increased read time tRc. As shown in FIGS. 12 and 13, the read time tRp in case of independent ECC decoding and de-randomizing according to example embodiments may be decreased compared with the read time tRc in case of sequential ECC decoding and de-randomizing.

Figure 14:
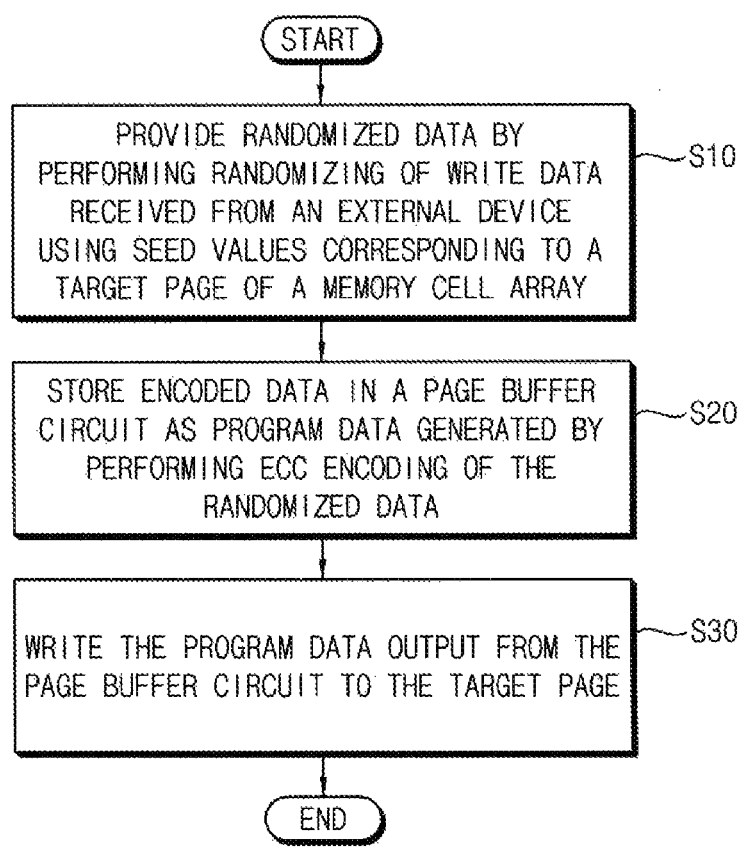
FIG. 14 is a flow chart illustrating a write operation in a non-volatile memory device according to example embodiments.

FIG. 14 is a flow chart illustrating a write operation in a non-volatile memory device according to example embodiments.

A method corresponding to a write operation of a non-volatile memory device is illustrated in FIG. 14. Referring to FIG. 14, randomized data are provided by performing randomizing of write data received from an external device (e.g., a memory controller) using seed values corresponding to a target page of a memory cell array (S10). Encoded data are stored in a page buffer circuit as program data generated by performing ECC encoding of the randomized data (S20). The program data output from the page buffer circuit are written to the target page of the memory cell array (S30).

As such, the randomizing and the ECC encoding are associated and performed sequentially during the write operation, whereas the ECC decoding and the de-randomizing are separated and performed independently during the read operation as described above.

Figure 15:
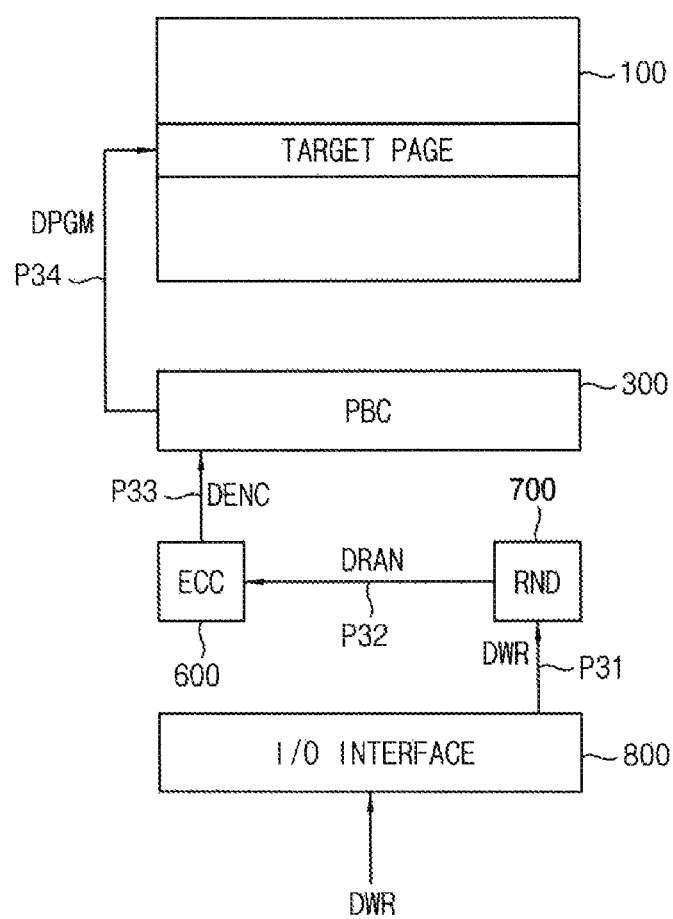
FIG. 15 is a diagram illustrating a data flow in case of performing the write operation of FIG. 14 according to example embodiments.

FIG. 15 is a diagram illustrating a data flow in case of performing the write operation of FIG. 14 according to example embodiments. Data paths P31 through P34 in FIG. 15 represent temporal order of the data flow.

Referring to FIG. 15, write data DWR received from an external device are provided through the I/O interface 800 to the on-chip randomization circuit (RND) 700 (P31). The on-chip randomization circuit 700 performs the randomizing of the write data DWR using seed values corresponding to a target page of the memory cell array 100 to provide the randomized data DRAN to the ECC engine 600 (P32). The ECC engine 600 performs the ECC encoding of the randomized data DRAN and the encoded data DENC are stored in the page buffer circuit 300 (P33). As described with reference to FIG. 8, one page may include a plurality of ECC sectors. In this case, the on-chip randomization circuit 700 and the on-chip ECC engine 600 may perform receiving the write data DWR (P31), the randomizing, the ECC encoding and storing the encoded data DENC (P33) for one ECC sector, and then repeat the same operations for the next ECC sector. After the encoded data DENC are stored in the page buffer circuit 300 as program data DPGM with respect to all of the ECC sectors, the program data DPGM output from the page buffer circuit 300 are written or programmed to the target page of the memory cell array 100 (P34).

Figure 16:
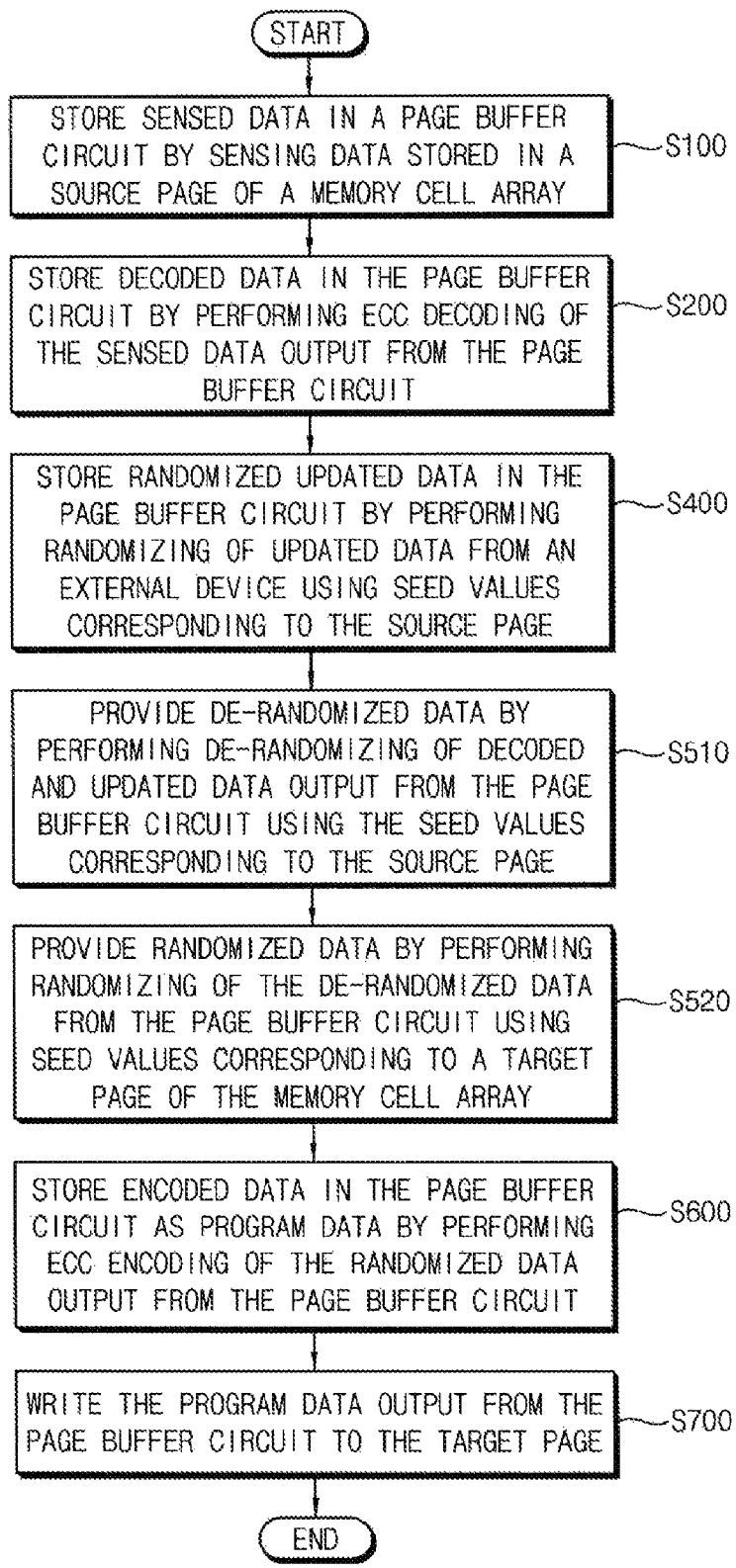
FIG. 16 is a flow chart illustrating a copy-back operation in a non-volatile memory device according to example embodiments.

FIG. 16 is a flow chart illustrating a copy-back operation in a non-volatile memory device according to example embodiments.

A method corresponding to a copy-back operation to move data stored in a first page (e.g., a source page) to a second page (e.g., a target page) of a non-volatile memory device is illustrated in FIG. 16. During the copy-back operation, a portion of bits in data of the first page may be replaced with updated bits to be stored in the second page.

Referring to FIG. 16, sensed data are stored in a page buffer circuit by sensing data stored in a source page of a memory cell array (S100). Decoded data are stored in the page buffer circuit by performing ECC decoding of the sensed data output from the page buffer circuit (S200). Randomized updated data are stored in the page buffer circuit by performing randomizing of updated data from an external device using seed values corresponding to the source page (S400). De-randomized data are provided by performing de-randomizing of decoded and updated data output from the page buffer circuit using the seed values corresponding to the source page (S510). Randomized data are provided by performing randomizing of the de-randomized data output from the page buffer circuit using seed values corresponding to a target page of the memory cell array (S520). Encoded data are stored in the page buffer circuit as program data by performing ECC encoding of the randomized data output from the page buffer circuit (S600). The program data output from the page buffer circuit are written to the target page (S700).

Figure 17:
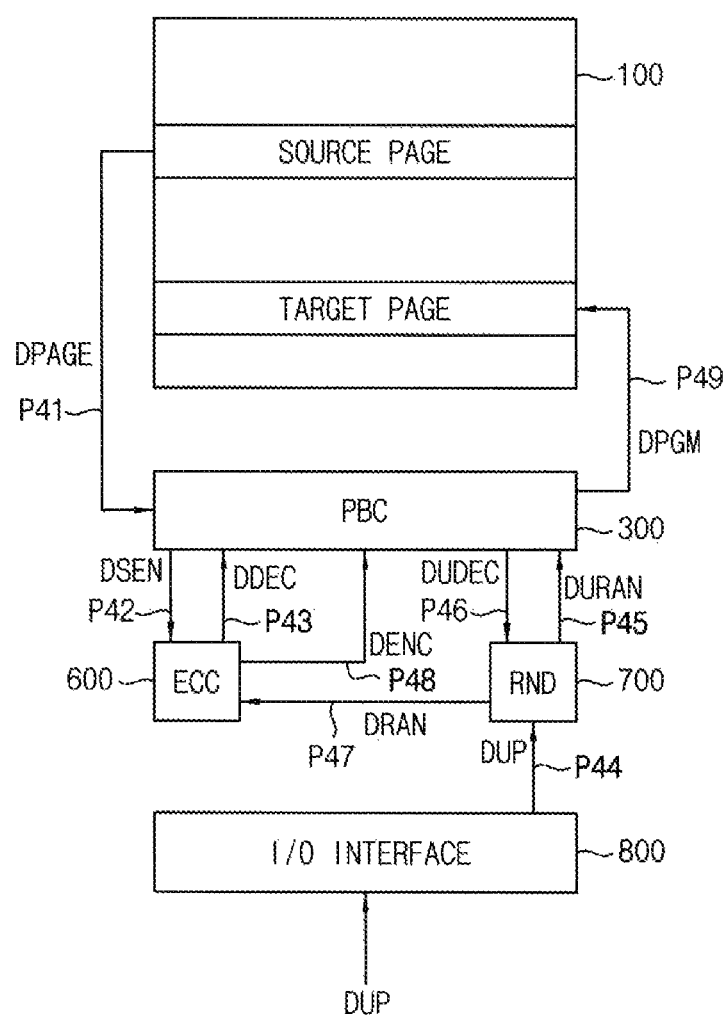
FIG. 17 is a diagram illustrating a data flow in case of performing the copy-back operation of FIG. 16 according to example embodiments.
Figure 18:
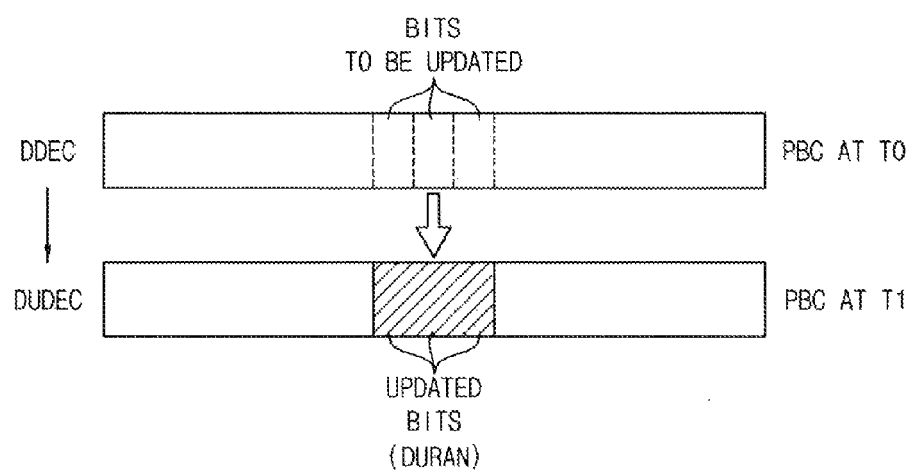
FIG. 18 is a diagram illustrating a method of storing updated bits in case of FIG. 17 according to example embodiments.

FIG. 17 is a diagram illustrating a data flow in case of performing the copy-back operation of FIG. 16 according to example embodiments, and FIG. 18 is a diagram illustrating a method of storing updated bits in case of FIG. 17 according to example embodiments. First through ninth data paths P41 through P49 in FIG. 17 represent temporal order of the data flow.

Referring to FIG. 17, sensed data DSEN are stored in the page buffer circuit (PBC) 300 by sensing the data DPAGE stored in the source page of the memory cell array 100 (P41). The on-chip ECC engine 600 receives the sensed data DSEN from the page buffer circuit 300 (P42) to perform the ECC decoding and the decoded data DDEC are stored in the page buffer circuit 300 (P43). As described with reference to FIG. 8, one page may include a plurality of ECC sectors. In this case, the on-chip ECC engine 600 may perform receiving the sensed data DSEN (P42), the ECC decoding and storing the decoded data DDEC (P43) for one ECC sector, and then repeat the same operations for the next ECC sector. Meanwhile, updated data DUP received from an external device are provided through the input-output interface 800 to the on-chip randomization circuit (RND) 700 (P44). The on-chip randomization circuit 700 performs the randomizing of the updated data DUP using seed values corresponding to the source page of the memory cell array 100, and the randomized updated data DURAN are stored in the page buffer circuit 300 (P45). As a result, the decoded and updated data DUDEC are stored in the page buffer circuit 300. The on-chip randomization circuit 700 receives the decoded and updated data DUDEC from the page buffer circuit 300 (P46) to perform the de-randomizing of the decoded and updated data DUDEC using the seed values corresponding to the source page and provide the de-randomized data DDRAN (not shown in FIG. 17). Also the on-chip randomization circuit 700 performs the randomizing of the de-randomized data DDRAN using the seed values corresponding to the target page to provide the randomized data DRAN to the on-chip ECC engine 600 (P47). The on-chip ECC engine 600 performs the ECC encoding of the randomized data DRAN to store the encoded data DENC in the page buffer circuit 300 (P48) as program data DPGM. In a case where one page includes a plurality of ECC sectors, the on-chip randomization circuit 700 and the on-chip ECC engine 600 may perform receiving the decoded and updated data DUDEC (P46), the de-randomizing, the randomizing, the ECC encoding and storing the encoded data DENC (P48) for one ECC sector, and then repeat the same operations for the next ECC sector. After the encoded data DENC are stored in the page buffer circuit 300 as program data DPGM with respect to all of the ECC sectors, the program data DPGM output from the page buffer circuit 300 are written or programmed to the target page of the memory cell array 100 (P49).

FIG. 18 illustrates a method of storing the randomized updated data DURAN in the page buffer circuit (PBC) 300 along the fifth data path P45 in FIG. 17. T0 indicates a time point before the randomized updated data DURAN are stored in the page buffer circuit 300 and T1 indicates a time point after the randomized updated data DURAN are stored in the page buffer circuit 300. As illustrated in FIG. 18, only the randomized updated bits may be stored in the page buffer circuit PBC for replacing the corresponding bits to be updated in the decoded data DDEC stored in the page buffer circuit 300. The rest of bits in the decode data DDEC other than the randomized updated bits may be maintained in the page buffer circuit 300 without being replaced. As such, according to the update contents, only the randomized updated bits may be stored in the page buffer circuit 300 whereas the rest of bits may be maintained in the page buffer circuit 300, and thus the copy-back time and the power consumption may be reduced.

Figure 19:
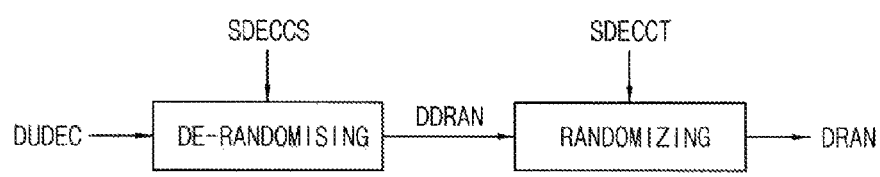
FIG. 19 is a diagram illustrating a randomization in case of FIG. 17 according to example embodiments.

FIG. 19 is a diagram illustrating a randomization in case of FIG. 17 according to example embodiments.

Referring to FIGS. 17 and 19, the on-chip randomization circuit 700 may receive the decoded and updated data DUDEC along the sixth data path P46 and provide the de-randomized data DDRAN by performing the de-randomizing of the decoded and updated data DUDEC using the seed values SDECCS corresponding to the source page. In addition, the on-chip randomization circuit 700 may perform the randomizing of the de-randomized data DDRAN using the seed values SDECCT corresponding to the target page to provide the randomized data DRAN. The randomized data DRAN are provided to the on-chip ECC circuit 600 for the ECC encoding before written to the target page of the memory cell array 100.

In example embodiments, the on-chip randomization circuit 700 may include a pair of the seed generators as described with reference to FIG. 10 and a pair of the converters as described with reference to FIG. 10. The sequential de-randomizing and randomizing during the copy-back operation may be performed on data units of the ECC sectors. In this case, the seed values SDECCS corresponding to the source page and the seed values SDECCT corresponding to the target page in FIG. 19 may correspond to the ECC seed signal SDECC instead of the input-output seed signal SDIO in FIG. 10.

Figure 20:
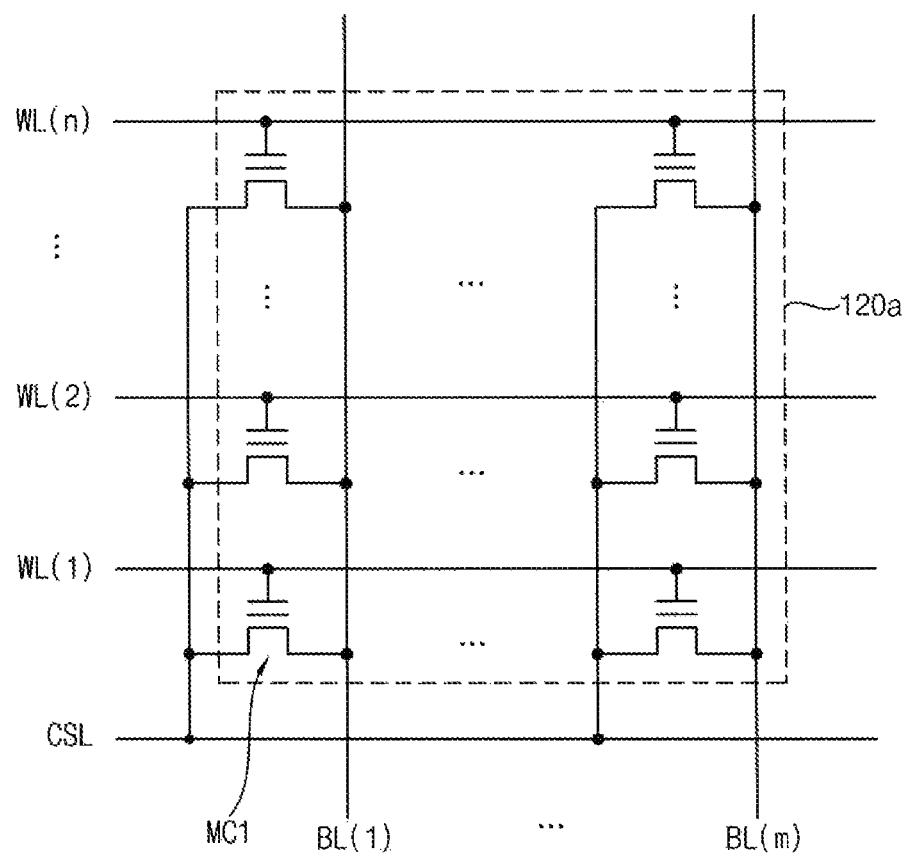
FIGS. 20, 21 and 22 are diagrams illustrating examples of a memory cell array included in the non-volatile memory device of FIG. 3 according to example embodiments.
Figure 21:
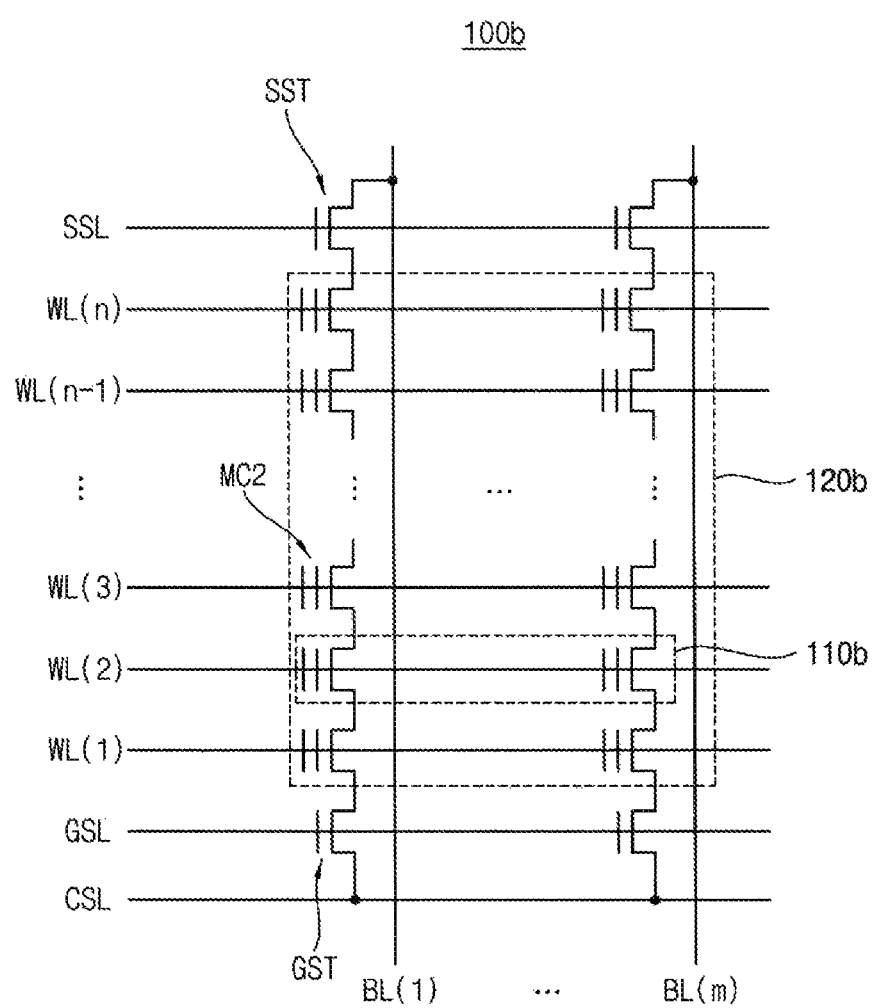
Figure 22:
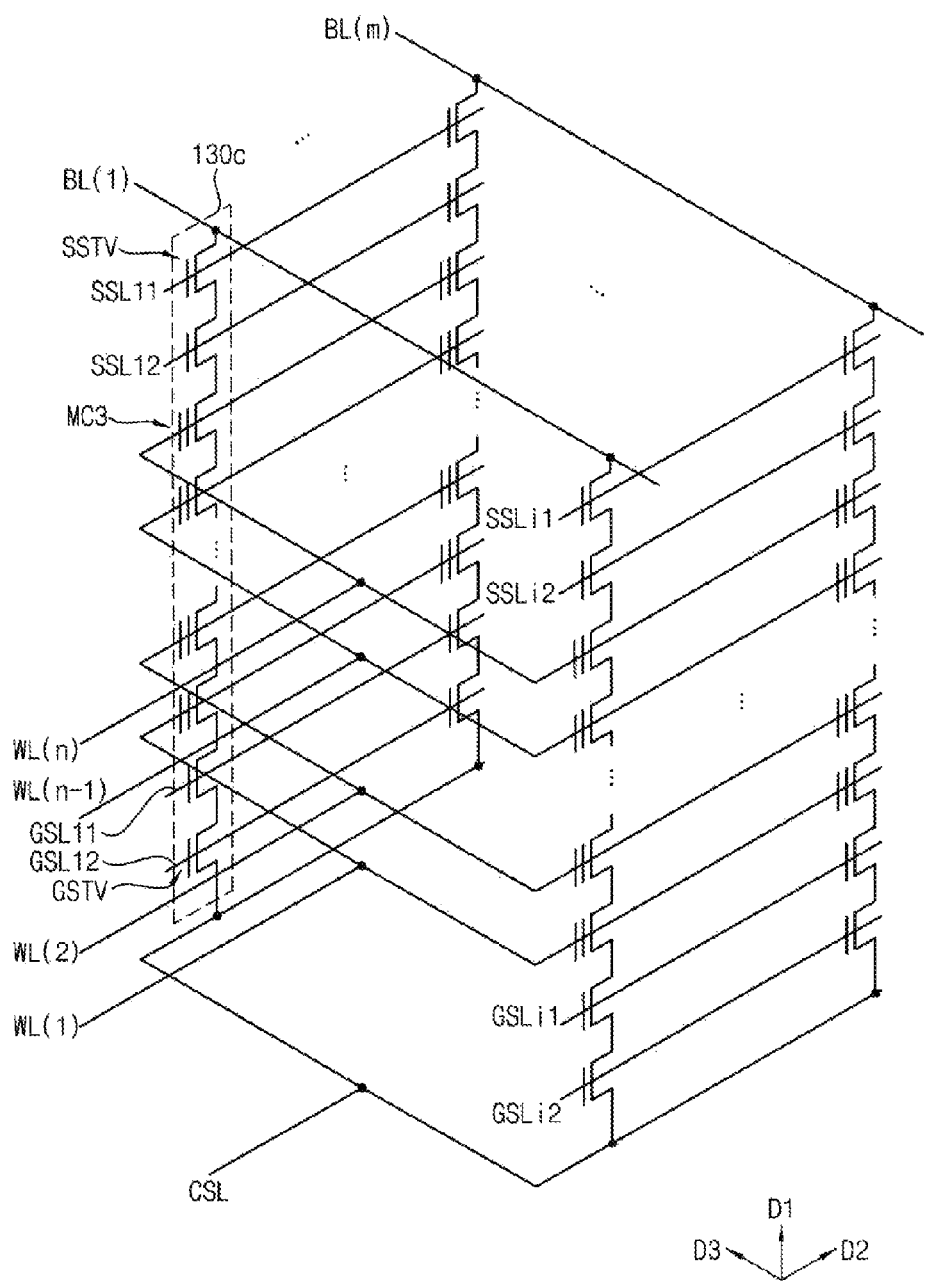

FIGS. 20, 21 and 22 are diagrams illustrating examples of a memory cell array included in the non-volatile memory device of FIG. 3 according to example embodiments.

FIG. 20 is a circuit diagram illustrating a memory cell array included in a NOR flash memory device. FIG. 21 is a circuit diagram illustrating a memory cell array included in a NAND flash memory device. FIG. 22 is a circuit diagram illustrating a memory cell array included in a vertical flash memory device.

Referring to FIG. 20, a memory cell array 100a may include a plurality of memory cells MC1. Memory cells in the same column may be connected in parallel between one of bitlines BL(1), . . . , BL(m) and a common source line CSL. Memory cells in the same row may be commonly connected to the same wordline among wordlines WL(1), . . . , WL(n). For example, memory cells in a first column may be connected in parallel between a first bitline BL(1) and the common source line CSL. Memory cells in a first row may be commonly connected to a first wordline WL(1). The memory cells MC1 may be controlled by a voltage on the wordlines WL(1), . . . , WL(n).

In the NOR flash memory device including the memory cell array 100a, a read operation and a program operation may be performed per byte or word, and an erase operation may be performed per block 120a. In the program operation, a bulk voltage having a range of about −0.1 to −0.7 volts may be applied to a bulk substrate of the NOR flash memory device.

Referring to FIG. 21, the memory cell array 100b may include string select transistors SST, ground select transistors GST and a plurality of memory cells MC2. The string select transistors SST may be connected to bitlines BL(1), . . . , BL(m), and the ground select transistors GST may be connected to a common source line CSL. The memory cells MC2 may be connected in series between the string select transistors SST and the ground select transistors GST. Memory cells in the same row may be connected to the same wordline among wordlines WL(1), . . . , WL(n). For example, 16, 32 or 64 wordlines may be disposed between a string select line SSL and a ground select line GSL.

The string select transistors SST may be connected to the string select line SSL, and may be controlled by a voltage on the string select line SSL. The ground select transistors GST may be connected to the ground select line GSL, and may be controlled by a voltage on the ground select line GSL. The memory cells MC2 may be controlled by a voltage on the wordlines WL(1), . . . , WL(n).

In the NAND flash memory device including the memory cell array 100b, a read operation and a program operation may be performed per page 110b, and an erase operation may be performed per block 120b. During the program operation, a bulk voltage having a level of about 0 volt may be applied to a bulk substrate of the NAND flash memory device.

According to example embodiments, each page buffer may be connected to an odd-numbered bitline and an even-numbered bitline. In this case, the odd-numbered bitlines may form odd-numbered pages, the even-numbered bitlines may form even-numbered pages, and program operations for the odd-numbered pages and the even-numbered pages may be alternately performed.

Referring to FIG. 22, a memory cell array 100c may include a plurality of strings 130c each of which has a vertical structure. The plurality of strings 130c may be formed in a second direction to define a string column, and a plurality of string columns may be formed in a third direction to define a string array. Each string may include string select transistors SSTV, ground select transistors GSTV, and a plurality of memory cells MC3 that are formed in a first direction D1 and are connected in series between the string select transistors SSTV and the ground select transistors GSTV.

The string select transistors SSTV may be connected to bitlines BL(1), . . . , BL(m), and the ground select transistors GST may be connected to a common source line CSL. The string select transistors SSTV may be connected to string select lines SSL11, SSL12, . . . , SSLi1, SSLi2, and the ground select transistors GSTV may be connected to ground select lines GSL11, GSL12, . . . , GSLi1, GSLi2. The memory cells in the same layer may be connected to the same wordline among wordlines WL(1), WL(2), . . . WL(n−1), WL(n). Each string select line and each ground select line may extend in the second direction D2, and the string select lines SSL11, . . . , SSLi2 and the ground select lines GSL11, . . . , GSLi2 may be formed in the third direction D3. Each wordline may extend in the second direction D2, and the wordlines WL(1), . . . , WL(n) may be formed in the first direction D1 and the third direction D3. Each bitline may extend in the third direction D3, and the bitlines BL(1), . . . , BL(m) may be formed in the second direction D2. The memory cells MC3 may be controlled by a voltage on the wordlines WL(1), . . . , WL(n).

Similarly to the NAND flash memory device, in the vertical flash memory device including the memory cell array 100c, a read operation and a program operation may be performed per page, and an erase operation may be performed per block.

Although not illustrated in FIG. 22, according to example embodiments, two string select transistors included in a single string may be connected to a single string select line, and two ground select transistors included in the single string may be connected to a single ground select line. According to example embodiments, the single string may include one string select transistor and one ground select transistor.

Figure 23:
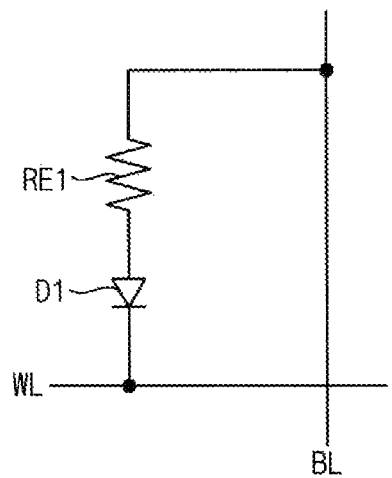
FIGS. 23 and 24 are diagrams illustrating examples of a resistive memory cell included in a memory cell array according to example embodiments.
Figure 24:
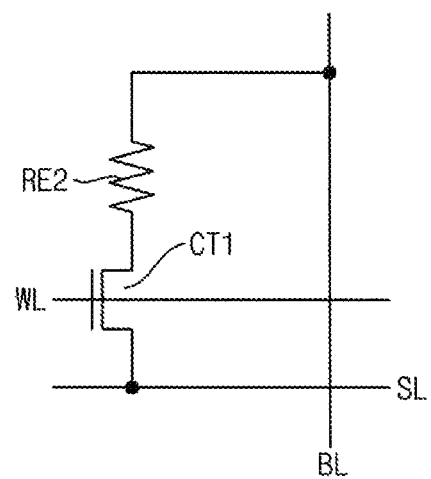

FIGS. 23 and 24 are diagrams illustrating examples of a resistive memory cell included in a memory cell array according to example embodiments.

Referring to FIG. 23, a memory cell may include a resistive element RE1 and a diode D1 serially coupled between a bitline BL and a wordline WL. The memory cell of FIG. 23 may determine a resistance distribution of the resistive element RE1 by controlling voltages applied to the bitline BL and the wordline WL. The configuration of the memory cell of FIG. 23 may be adopted when the resistive element RE1 is a unipolar type. The write operation may be performed by applying the voltages to the bitline BL and the wordline WL, thereby controlling a voltage difference between both ends of the resistive element RE1 or controlling a current flowing through the resistive element RE1.

FIG. 24 is a diagram illustrating another example of a resistive memory cell in a memory cell array.

Referring to FIG. 24, a memory cell may include a resistive element RE2 and a switching element, such as a cell transistor CT1, serially coupled between a bitline BL and a source line SL. A gate of the cell transistor CT1 is coupled to a wordline WL. The memory cell of FIG. 24 may determine a resistance distribution of the resistive element RE2 by controlling voltages applied to the bitline BL and the source line SL. The configuration of the memory cell of FIG. 24 may be adopted when the resistive element RE2 is a bipolar type as well as a unipolar type.

When the resistive element RE2 is a unipolar type, a resistance value of the resistive element RE2 is controlled by magnitude of applied voltage. When the resistive element RE2 is a bipolar type, the resistance value of the resistive element RE2 may be controlled by direction (i.e. polarity) of the applied voltage as well as magnitude of the applied voltage. The write operation may be performed by applying the voltages to the bitline BL and the source line SL, thereby controlling a voltage difference between both ends of the resistive element RE2 or controlling a current flowing through the resistive element RE2.

Figure 25:
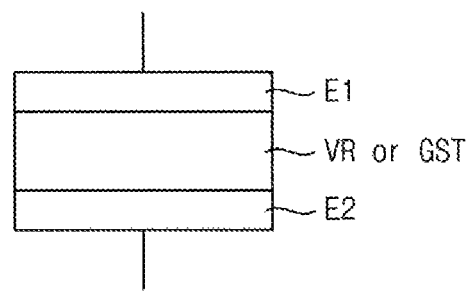
FIG. 25 is a diagram illustrating an example of a unipolar resistive element in the resistive memory cell of FIGS. 23 and 24 according to example embodiments.

FIG. 25 is a diagram illustrating an example of a unipolar resistive element in the resistive memory cell of FIGS. 23 and 24 according to example embodiments.

Referring to FIG. 25, the resistive element RE1 of FIG. 23 or the resistive element RE2 of FIG. 24 may include a first electrode E1, a second electrode E2 and resistive material between the electrodes E1 and E2. The electrodes E1 and E2 may be formed with metal such as tantalum (Ta), platinum (Pt), etc. The resistive material may include transition-metal oxide (VR) such as cobalt oxide, or phase change material such as GeSbTe (GST), etc. The phase change material may be in amorphous state or in crystalline state depending on heating time and/or heating temperature, and thus the phase change material may change its resistance according to phase change.

PRAM using phase change materials, RRAM using materials having variable resistance, and MRAM using ferromagnetism materials may be differentiated from each other, and those may be totally referred to as resistive memories. Method and devices according to example embodiments may be applied to various resistive memories including PRAM, RRAM and MRAM.

The resistive material between the electrodes E1 and E2 is required to have a plurality of stable states having different resistance, and various resistive materials are being studied.

For example, while increasing a voltage applied to material having characteristic of Negative Differential Resistance (NDR), resistance of the NDR material abruptly increases at a reset voltage (Vreset), the relatively high resistance is maintained afterwards, and then the NDR material transitions to a state of relatively low resistance at a set voltage (Vset). In this case, the set voltage (Vset) for decreasing the resistance of the NDR material is greater than the reset voltage (Vreset) for decreasing the resistance of the NDR material.

Chalcogenide using telluride compound such as GeSbTe has relatively high resistance when relatively low voltage is applied, and transitions to a state of relatively low resistance if a sufficiently high voltage is applied. In this case, the set voltage (Vset) for decreasing the resistance of the Chalcogenide is smaller than the reset voltage (Vreset) for decreasing the resistance of the Chalcogenide.

As such, an on-state of relatively low resistance and an off-state of relatively high resistance may be programmed or written into memory cells by applying the set voltage (Vset) and the reset voltage (Vreset) corresponding to characteristics of various materials included in the memory cells.

Figure 26:
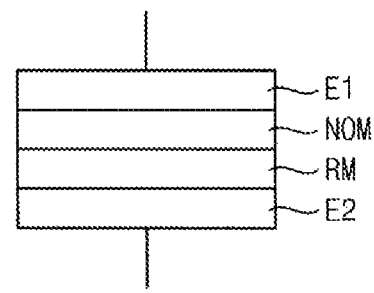
FIG. 26 is a diagram illustrating an example of a bipolar resistive element in the resistive memory cell of FIG. 24 according to example embodiments.

FIG. 26 is a diagram illustrating an example of a bipolar resistive element in the resistive memory cell of FIG. 24 according to example embodiments.

Referring to FIG. 26, the resistive element RE2 of FIG. 24 may include a first electrode E1, a second electrode E2, non-ohmic material (NOM) and resistive material (RM) between the electrodes E1 and E2. In this case, the on-state and the off-state may be programmed or written into memory cells by applying opposite voltages to the electrodes E1 and E2. In other words, the on-state and the off-state may be determined according to polarity of the applied voltage.

Figure 27:
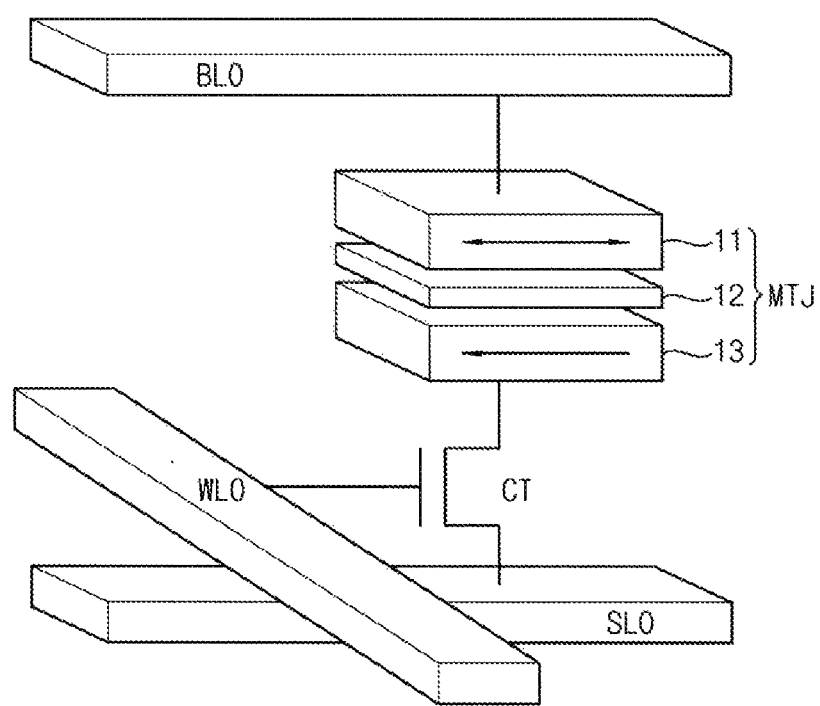
FIG. 27 is a diagram illustrating an example of a spin-transfer torque magneto-resistive random access memory (STT-MRAM) cell included in a memory cell array according to example embodiments.

FIG. 27 is a diagram illustrating an example of a spin-transfer torque magneto-resistive random access memory (STT-MRAM) cell included in a memory cell array according to example embodiments.

Referring to FIG. 27, the STT-MRAM cell may include an MTJ element and a cell transistor CT. A gate of the cell transistor CT is coupled to a corresponding wordline WL0, a first electrode of the cell transistor CT is coupled to a corresponding bitline BL0 via the MTJ element, and a second electrode of the cell transistor CT is coupled to a source line SL0.

The MTJ element may include a pinned layer 13, a free layer 11 and a barrier layer 12 between the two layers 11 and 13. The magnetization direction of the pinned layer 13 is fixed but the magnetization direction of the free layer 11 may be varied, according to the written data, between the same direction as or opposite direction to the magnetization direction of the pinned layer 13. In one example embodiment, an anti-ferromagnetic layer may be further included in the MTJ element to enforce the magnetization direction of the pinned layer 13.

For example, to perform the write operation of the STT-MRAM cell, a high level voltage is applied to the wordline WL0 to turn on the cell transistor CT, and a write current is applied between the bitline BL0 and the source line SL0.

For example, to perform the read operation of the STT-MRAM cell, a high level voltage is applied to the wordline WL0 to turn on the cell transistor CT, a read current is applied to flow from the bitline BL0 to the source line SL0, and the resistance value is measured to determine the data stored in the MTJ element.

Figure 28:
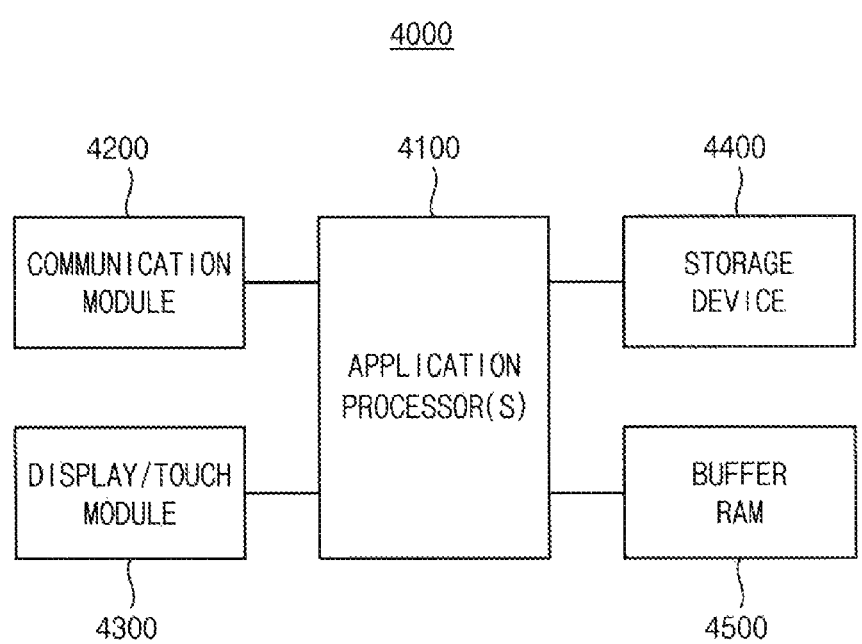
FIG. 28 is a block diagram illustrating a mobile device according to example embodiments.

FIG. 28 is a block diagram illustrating a mobile device according to example embodiments.

Referring to FIG. 28, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be eMMC, SSD, UFS device, etc. The storage device 4400 may include the non-volatile memory device disclosed herein. The storage device 4400 may have a configuration for performing the above-described ECC and randomization control method.

The mobile RAM 4500 temporarily stores data used for processing operations of the mobile device 4000.

A memory device or a storage device according to disclosed embodiments may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

As described above, the non-volatile memory device and the method of operating the non-volatile memory device according to example embodiments may enhance performance of the non-volatile memory device by separating or independently performing the ECC decoding and the de-randomizing. The seed values may be stored while the ECC decoding is performed to perform the de-randomizing using the stored seed values, and thus the read time may be reduced. In addition, according to the result of the ECC decoding, only the correction bits may be stored in the page buffer circuit whereas the rest of bits may be maintained in the page buffer circuit, and thus the read time and the power consumption may be reduced.

The present disclosure may be applied to various devices and systems. For example, the present disclosure may be applied to systems such as be a memory card, a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of operating a non-volatile memory device, the method comprising:
   storing sensed data in a page buffer circuit by sensing data stored in a source page of a memory cell array;
   outputting the sensed data from the page buffer circuit;
   performing error correction code (ECC) decoding of the sensed data output from the page buffer circuit;
   storing the decoded data in the page buffer circuit; and
   providing de-randomized data to an external device as read data by performing de-randomizing of the decoded data output from the page buffer circuit using seed values corresponding to the source page.

2. The method of claim 1, wherein the ECC decoding is performed on data units of ECC sectors, and the de-randomizing is performed independently of the ECC decoding and regardless of the ECC sectors.

3. The method of claim 1, wherein storing the decoded data in the page buffer circuit includes:
   storing correction bits in the page buffer circuit for replacing error bits in the sensed data stored in the page buffer circuit.

4. The method of claim 3, wherein the rest of bits in the sensed data other than the error bits are maintained in the page buffer circuit without being replaced.

5. The method of claim 1, further comprising:
   storing the seed values output from a seed generator in a seed storage while the ECC decoding is performed on data units of ECC sectors; and
   outputting the stored seed values from the seed storage while the de-randomizing is performed.

6. The method of claim 5, wherein the seed storage includes a plurality of storage units respectively corresponding to the ECC sectors.

7. The method of claim 6, wherein storing the seed values in the seed storage includes:
   storing each of the seed values corresponding to each of the ECC sectors in each of the storage units based on a sector address signal.

8. The method of claim 7, wherein outputting the seed values from the seed storage includes:
   outputting one of the seed values from one of the storage units corresponding to a column address.

9. The method of claim 1, further comprising:
   providing randomized data by performing randomizing of write data received from the external device using seed values corresponding to a target page of the memory cell array;
   storing encoded data in the page buffer circuit as program data by performing ECC encoding of the randomized data; and
   writing the program data from the page buffer circuit to the target page.

10. The method of claim 9, wherein the randomizing is performed with respect to the write data corresponding to one ECC sector and then the ECC encoding is performed with respect to the randomized data corresponding to the one ECC sector.

11. The method of claim 1, further comprising:
    performing a copy-back operation to move data stored in a first page of the memory cell array to a second page of the memory cell array.

12. The method of claim 11, wherein, during the copy-back operation, a portion of bits in the data of the first page is replaced with updated bits received from the external device to be stored in the second page.

13. The method of claim 12, further comprising:
    after the ECC decoding is performed with respect to the data of the first page and the decoded data is stored in the page buffer circuit, performing randomizing of the updated bits using the seed values corresponding to the first page and storing only the randomized updated bits in the page buffer circuit.

14. A non-volatile memory device comprising:
    a memory cell array including a plurality of memory cells forming a plurality of pages;
    a page buffer circuit configured to store data of one page of the plurality of pages;
    an on-chip error correction code (ECC) engine configured to:

perform ECC encoding of a first set of data received from an external device such that the on-chip ECC engine provides encoded data to the page buffer circuit, or perform ECC decoding of a second set of data stored in the page buffer circuit such that the on-chip ECC engine provides decoded data to the page buffer circuit; and an on-chip randomization circuit configured to:

perform randomizing the encoded data using seed values corresponding to a target page of the plurality of pages such that the on-chip randomization circuit provides randomized data to the target page, or perform de-randomizing the decoded data using seed values corresponding to a source page of the plurality of pages such that the on-chip randomization circuit provides de-randomized data to an external device as read data.

15. The non-volatile memory device of claim 14, wherein the ECC decoding is performed on data units of ECC sectors, and the de-randomizing is performed during the read data output.

16. The method of claim 1, wherein the performing de-randomizing of the decoded data occurs during the read data output.

17. A memory device comprising:

a memory cell array including a plurality of memory cells;

a page buffer circuit configured to store a first set of data output from the plurality of memory cells and a second set of data;

an error correction code (ECC) circuit configured to perform ECC decoding of the first set of data output from the page buffer circuit such that the ECC circuit provides the second set of data to the page buffer circuit as decoded data; and a randomization circuit configured to perform de-randomizing of the second set of data output from the page buffer circuit such that the randomization circuit provides de-randomized data to an external device as read data.

18. The memory device of claim 17, wherein the randomization circuit includes:

a seed generator configured to generate an ECC seed signal including seed values in response to a page address, and a seed storage including a plurality of storage unit each configured to store a seed value of the seed values in response to a column address.

19. The memory device of claim 18, wherein when the ECC circuit performs ECC decoding of the first set of data the seed storage stores the seed value in response to the column address, and wherein after the ECC circuit performs ECC decoding of the first set of data the randomization circuit performs de-randomizing the second set of data.

20. The memory device of claim 17, wherein the randomization circuit is configured to perform de-randomizing of the second set of data during the read data output.

* * * * *